(12) United States Patent
Lee et al.

(10) Patent No.: US 8,242,018 B2
(45) Date of Patent: Aug. 14, 2012

(54) SEMICONDUCTOR DEVICE HAVING FINE CONTACTS AND METHOD OF FABRICATING THE SAME

(75) Inventors: Ji-young Lee, Yongin-si (KR); Hyun-jae Kang, Gunpo-si (KR); Sang-gyun Woo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 12/943,142

(22) Filed: Nov. 10, 2010

(65) Prior Publication Data

US 2011/0076846 A1 Mar. 31, 2011

Related U.S. Application Data

(62) Division of application No. 11/367,436, filed on Mar. 6, 2006, now Pat. No. 7,855,408.

(30) Foreign Application Priority Data

Apr. 19, 2005 (KR) ........................ 10-2005-0032296

(51) Int. Cl.
*H01L 21/44* (2006.01)
(52) U.S. Cl. ................................ 438/667; 257/E21.159
(58) Field of Classification Search .................. 438/667; 257/E21.159
See application file for complete search history.

(56) References Cited

U.S. PATENT DOCUMENTS

| | | | |
|---|---|---|---|
| 5,405,796 A | 4/1995 | Jones, Jr. | |
| 5,432,739 A | 7/1995 | Pein | |
| 6,060,346 A | 5/2000 | Roh et al. | |
| 6,197,682 B1 | 3/2001 | Drynan et al. | |
| 6,613,621 B2 | 9/2003 | Uh et al. | |
| 6,638,441 B2 | 10/2003 | Chang et al. | |
| 6,689,658 B2 | 2/2004 | Wu | |
| 6,815,704 B1 | 11/2004 | Chen | |
| 6,853,024 B1 | 2/2005 | Tu | |
| 7,057,225 B2 | 6/2006 | Keeth et al. | |
| 2004/0164328 A1 | 8/2004 | Lee et al. | |
| 2005/0098896 A1 | 5/2005 | Huang et al. | |
| 2005/0124132 A1 | 6/2005 | Tu | |
| 2006/0186733 A1 | 8/2006 | Drumm | |

FOREIGN PATENT DOCUMENTS

| | | |
|---|---|---|
| JP | 06-069153 | 3/1994 |
| JP | 09-092800 | 4/1997 |
| JP | 2000-183304 | 6/2000 |
| JP | 2002-110930 | 4/2002 |
| KR | 1020010058351 A | 7/2001 |
| KR | 1020030001084 A | 1/2003 |
| KR | 1020030002807 A | 1/2003 |
| KR | 1020030009572 A | 2/2003 |

OTHER PUBLICATIONS

Japanese Office Action Dated Feb. 28, 2012.

*Primary Examiner* — David S Blum
(74) *Attorney, Agent, or Firm* — Volentine & Whitt, PLLC

(57) ABSTRACT

A semiconductor device has a structure of contacts whose size and pitch are finer that those that can be produced under the resolution provided by conventional photolithography. The contact structure includes a semiconductor substrate, an interlayer insulating layer disposed on the substrate, annular spacers situated in the interlayer insulating layer, first contacts surrounded by the spacers, and a second contact buried in the interlayer insulating layer between each adjacent pair of the first spacers. The contact structure is formed by forming first contact holes in the interlayer insulating layer, forming the spacers over the sides of the first contact holes to leave second contact holes within the first contact holes, etching the interlayer insulating layer from between the spacers using the first spacers as an etch mask to form third contact holes, and filling the first and second contact holes with conductive material. In this way, the pitch of the contacts can be half that of the first contact holes.

21 Claims, 25 Drawing Sheets

SEMICONDUCTOR DEVICE HAVING FINE CONTACTS AND METHOD OF FABRICATING THE SAME

RELATED APPLICATIONS

This is a divisional application of U.S. patent application Ser. No. 11/367,436, filed Mar. 6, 2006, now U.S. Pat. No. 7,855,408, titled "SEMICONDUCTOR DEVICE HAVING FINE CONTACTS.

BACKGROUND OF THE INVENTION

1. Field of the Invention

The present invention relates to a semiconductor device and to a method of fabricating the same. More particularly, the present invention relates to a contact of a semiconductor device and to a method of fabricating the same.

2. Description of the Related Art

A typical semiconductor device includes several layers of circuitry, an insulating layer interposed between the layers, and contacts that extend through the insulating layer to connect the different layers of circuitry. Conventionally, photolithography has been used to remove portions of the insulating layer and form contact holes. These holes are then filled with conductive material to form the contacts. However, in recent years, the spacing between such contacts has been decreased to meet the demand for more highly integrated semiconductor devices. Moreover, the resolution provided by conventional photolithography technology is not sufficient to produce the finer contacts required of today's highly integrated semiconductor devices.

However, fine features of a semiconductor device can be formed through the use of spacers as disclosed in U.S. Pat. No. 6,063,688. More specifically, in this method, a first spacer is formed on a region of a semiconductor substrate. Then, a second spacer having a thickness less than that of the first spacer is formed on the sidewalls of the first spacer, and the first spacer is removed. This process is repeated until the spacing between the sidewalls of the spacer corresponds to the desired dimension of the feature to be formed.

Although the method disclosed in U.S. Pat. No. 6,063,688 can be used to form a pattern of fine lines, the method cannot be used to form a pattern of contact openings. Furthermore, the process of forming one of the spacers may damage the underlying semiconductor substrate. Furthermore, the method cannot be used to realize a structure having various types of contacts such as a memory device having both a contact for a capacitor lower electrode and a contact for a bit line.

SUMMARY OF THE INVENTION

An object of the present invention is to provide a semiconductor device having contacts whose size and pitch are finer than those that can be produced under the resolution provided by a conventional photolithography process.

Likewise, another object of the present invention is to provide a method of forming contacts of a semiconductor device whose size and pitch are finer than those that can be produced under the resolution provided by a conventional photolithography process.

According to an aspect of the present invention, there is provided a semiconductor device having a substrate, an interlayer insulating layer disposed on the substrate, first annular spacers situated in the interlayer insulating layer and arrayed in a row, first contacts extending through the interlayer insulating layer and surrounded by the first spacers, respectively, and a respective second contact buried in the interlayer insulating layer between each pair of the first spacers that are adjacent to each other in the row. Accordingly, the first and second contacts are aligned and alternately disposed in the row.

According to another aspect of the present invention, the contact structure is employed in a semiconductor device having gate lines of different widths, such as a flash memory device. According to this aspect of the present invention there is provided a semiconductor device having a semiconductor substrate, first gate lines and second gate lines running along the semiconductor substrate, a first interlayer insulating layer disposed on the semiconductor substrate over the gate lines, first annular spacers situated in the interlayer insulating layer and arrayed in a row, first contacts extending through the interlayer insulating layer and between a pair of adjacent ones of the first gate lines and each of which is surrounded by a respective one of the first spacers, and a respective second contact buried in the interlayer insulating layer between each pair of the first spacers that are adjacent to each other in the row. Each second contact also extends between the pair of adjacent ones of the first gate lines. Thus, the first and second contacts are aligned and alternately disposed the row.

In each of these contact structures, the width of the first contacts in the direction of the row is preferably three times the width of the second contact in the direction of the row, and the pitch of the first contacts along the row is two times the pitch of the first and the second contacts along the row.

According to another aspect of the present invention, there is provided a method of forming a contact structure of a semiconductor device, comprising forming an interlayer insulating layer on a semiconductor substrate, forming first contact holes in the interlayer insulating layer, forming first spacers that cover the sides of the first contact holes, respectively, and leave second contact holes within the first contact holes, removing the interlayer insulating layer from between the first spacers to thereby form at least one third contact hole, and filling the second contact holes and the at least one third contact hole with conductive material. Thus, first contacts are formed in the second contact holes, respectively, and a respective second contact is formed in each third contact hole.

Again, this method may be applied to the forming of a semiconductor device having gate lines of different widths, such as a flash memory. In this case, the present invention provides a method of forming a semiconductor device, comprising: forming a first interlayer insulating layer on a semiconductor substrate over the first and second gate lines that run along the substrate, forming first contact holes constituted by recesses in an upper portion of the first interlayer insulating layer, forming first spacers that cover the sides of the first contact holes, respectively, and leave second contact holes within the first contact holes, forming third contact holes that expose the semiconductor substrate at locations between adjacent ones of the first gate lines by extending the second contact holes downward through the first interlayer insulating layer, removing the first interlayer insulating layer from beneath locations between the first spacers to form at least one fourth contact hole, and filling the third and the fourth contact holes with conductive material. Thus, first contacts are formed in the third contact holes and a second contact is formed in each fourth contact hole.

In addition, an etch stop layer and a second interlayer insulating layer may be formed on the first interlayer insulating layer. In this case, a photoresist pattern is formed on the first interlayer insulating layer. The photoresist pattern fills the second contact holes and exposes the second interlayer insulating layer between adjacent ones of the first spacers.

Then, the second interlayer insulating layer is removed from between the adjacent ones of the first spacers by etching the second interlayer insulating layer using the photoresist pattern as an etch mask. Subsequently, the first interlayer insulating layer is etched to complete the forming of the fourth contact hole(s).

According to still another aspect of the invention, the interlayer insulating layer exhibits a high degree of etch selectivity relative to the material of the first spacers with respect to a first etch process. The interlayer insulating layer is etched using the first etch process to remove a portion(s) of the interlayer insulating layer, especially the portion(s) extending between the first spacers, to form one or more contact holes. The first etch process may be a dry etch in which the etch gas is $CHF_3/O_2$, $CH_2F_2$, $CH_3F$ or $C_4H_8$. In the case in which the interlayer insulating layer is a nitride layer, and the first spacers are of an oxide, the first etch process may be a wet etch process in which the interlayer insulating layer is etched with a phosphoric acid solution. On the other hand, in the case in which the interlayer insulating layer is an oxide layer, and the first spacers are of a nitride, the interlayer insulating layer may be etched with a hydrofluoric acid solution, a sulfuric acid solution, SC-1, or LAL.

BRIEF DESCRIPTION OF THE DRAWINGS

The above and other objects, features and advantages of the present invention will become more apparent from the following detailed description of the preferred embodiments thereof made with reference to the attached drawings in which:

FIGS. 7A through 8B illustrate alternative versions of a second embodiment of a method of forming a contact structure according to the present invention, wherein FIGS. 7A and 8A are plan views and FIGS. 7B and 8B are corresponding sectional views of the structure during the course of its manufacture;

FIGS. 9A and 9B illustrate a third embodiment of a method of forming a contact structure according to the present invention, wherein FIG. 9A is a plan view and FIG. 9B is a corresponding sectional view of the structure during the course of its manufacture;

FIGS. 10A through 11C illustrate a fourth embodiment of a method of forming a contact structure according to the present invention, wherein FIGS. 10A and 11A are plan views, FIGS. 10A and 11A are plan views, FIGS. 10C and 11C are corresponding sectional views of the structure during the course of its manufacture as taken in a second direction perpendicular to the first direction.

DETAILED DESCRIPTION OF THE PREFERRED EMBODIMENTS

A first embodiment of the present invention will now be described with reference to FIGS. 1A through 6B. In these figures, line A-A of FIG. 2A shows the first direction along which the sectional views of FIGS. 1B, 2B . . . 7B are taken.

Figure 1A:
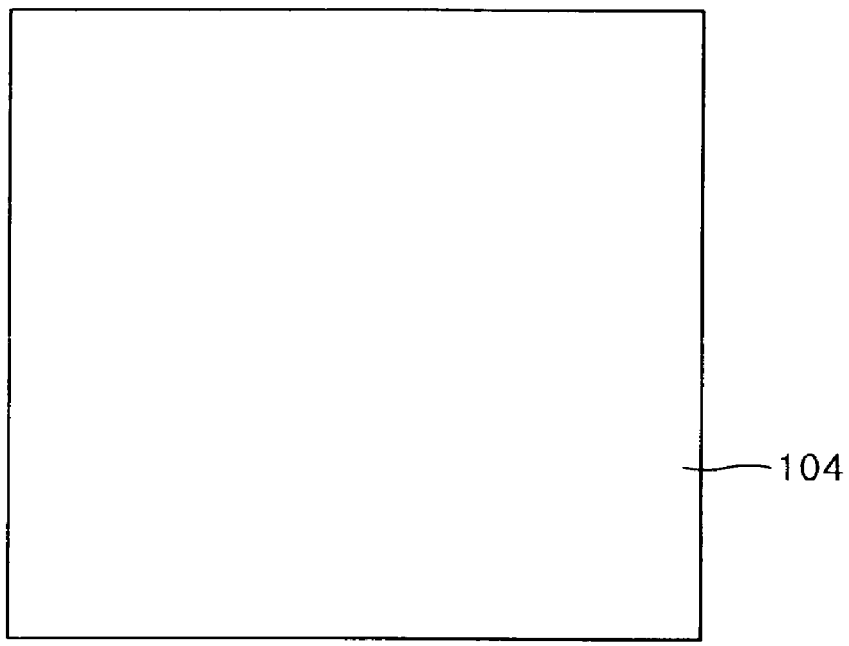
FIGS. 1A through 6B illustrate a first embodiment of a method of forming a contact structure according to the present invention, wherein FIGS. 1A, 2A . . . 6A are plan views and FIGS. 1B, 2B . . . 6B are corresponding sectional views of the structure during the course of its manufacture.
Figure 1B:
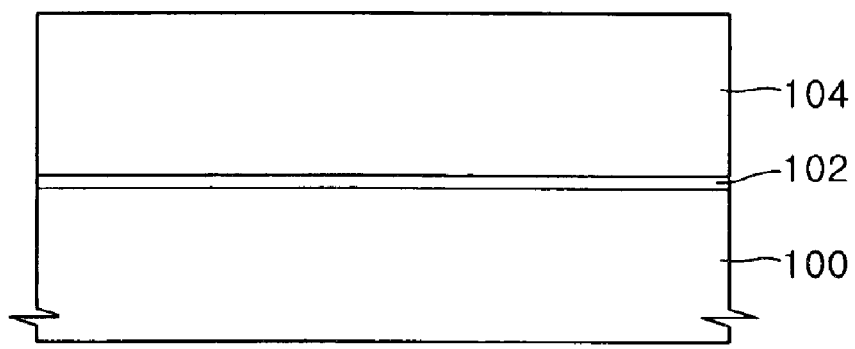

Referring first, though, to FIGS. 1A and 1B, a first etch stop layer 102 and an interlayer insulating layer 104 are sequentially formed on a substrate 100, for example, a silicon substrate, having a conductive region (not shown). The first etch stop layer 102 may be formed by depositing material, having a high etch selectivity with respect to the interlayer insulating layer 104, on the substrate 100. The interlayer insulating layer 104 may be of a low-k dielectric material, for example, silicon oxide.

Figure 2A:
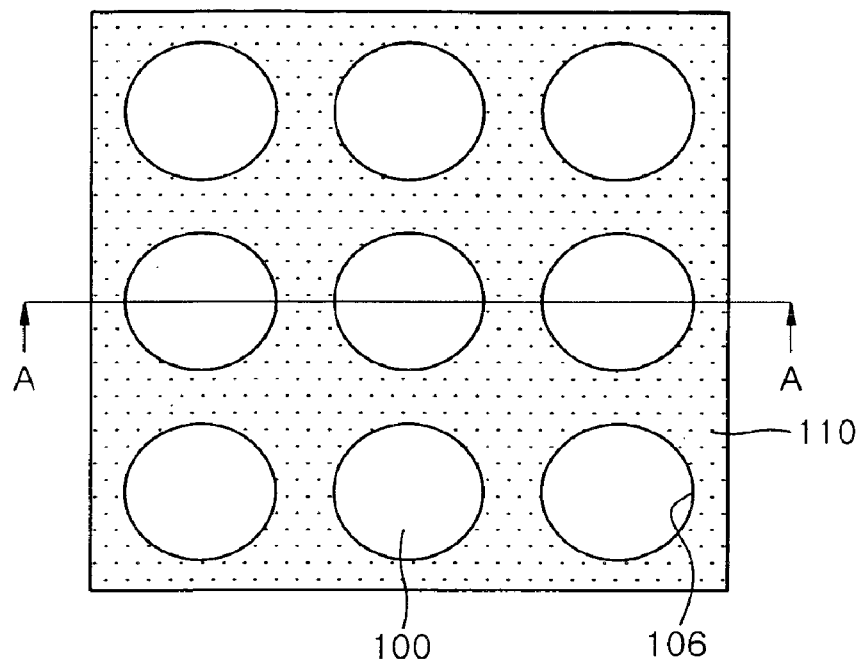
Figure 2B:
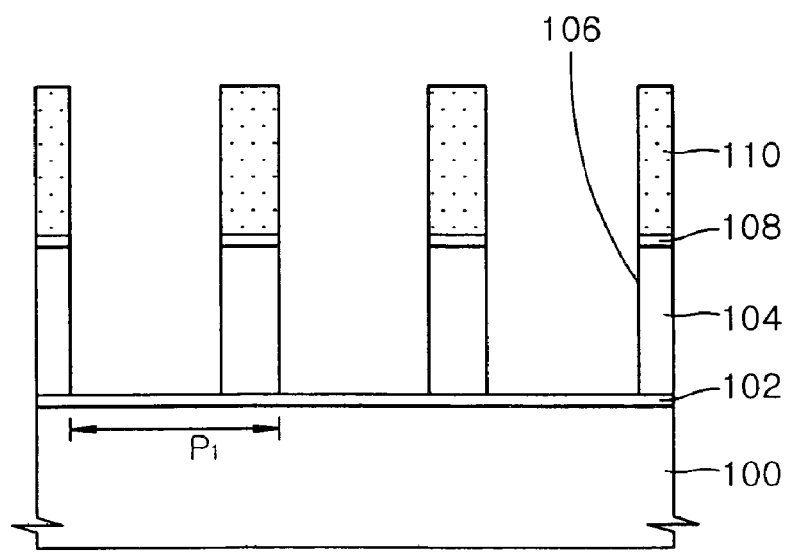

Referring to FIGS. 2A and 2B, a first photoresist pattern 110 is formed on the uppermost layer of the interlayer insulating layer 104. Then, a portion of the interlayer insulating layer 104 is etched, using the first photoresist pattern 110 as an etch mask, to form first contact holes 106 that extend through the interlayer insulating layer 104. The first contact holes 106 can be formed using a typical photolithographic technique because the diameters of the first contact holes 106 are relatively large. Specifically, the diameter of each first contact hole 106 is three times greater than the widths of second contacts 124 that will be described with reference to FIGS. 6A and 6B. Also, at this time, the pitch $P_1$ of the first contact holes 106 is relatively large.

Figure 3A:
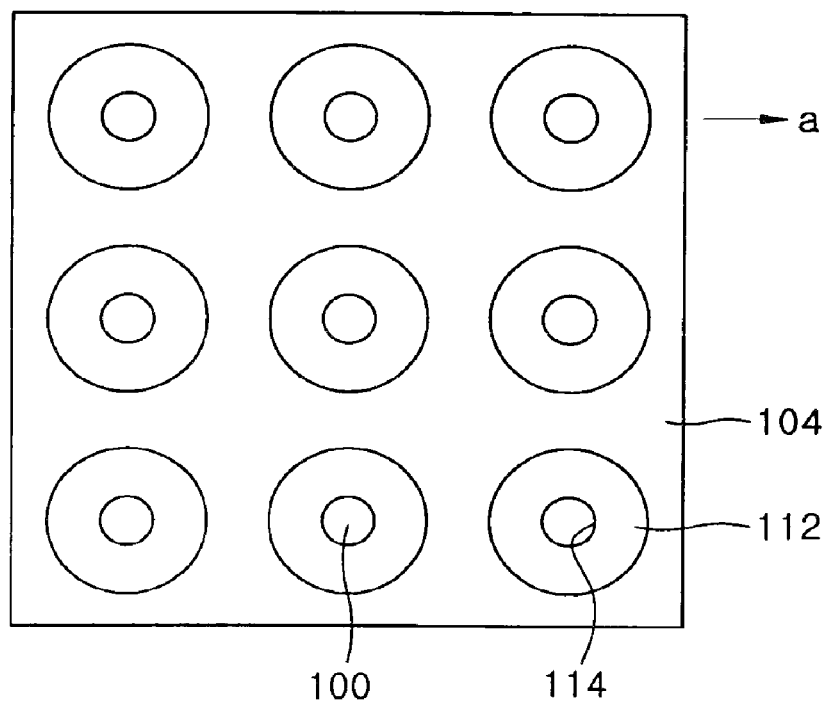
Figure 3B:
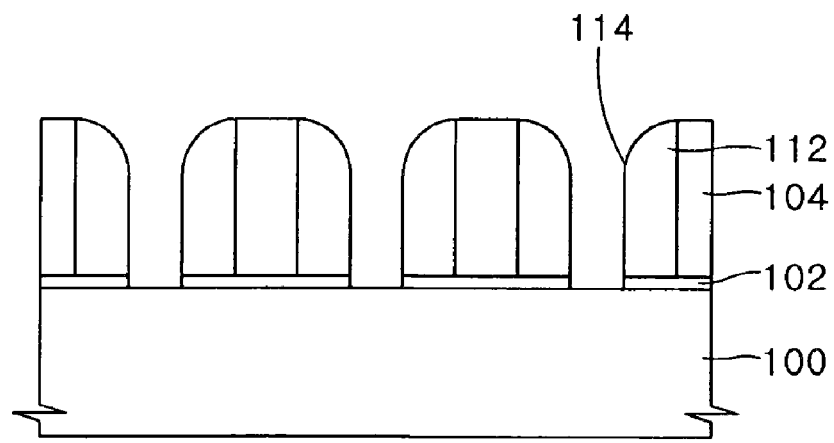

Referring to FIGS. 3A and 3B, a blanket deposition process is used to from a layer of first spacer material over the bottom and sides of the first contact holes 106. Then, the layer of first spacer material and the first etch stop layer 102 are etched to form first spacers 112 defining second contact holes 114 that expose the substrate 100. In the case in which the interlayer insulating layer 104 is an oxide layer, the layer of first spacer material is preferably a nitride layer. On the other hand, in the case in which the interlayer insulating layer 104 is a nitride layer, the layer of first spacer material may be an oxide layer. The oxide layer may be a thermal oxide layer, a CVD oxide layer, a high density plasma (HDP) oxide layer, or a layer of undoped silicate glass (USG). The nitride layer may be a layer of SiON, SiN, SiBN, or BN.

In any case, the interlayer insulating layer 104 must have a high etch selectivity with respect to the layer of first spacer material from which the first spacers 112 are formed. For example, the interlayer insulating layer 104 has a high etch selectivity with respect to the layer of first spacer material in a dry etch carried out using an etch gas of $CHF_3/O_2$, $CH_2F_2$, $CH_3F$ or $C_4H_8$. In the case of a wet etch, a nitride layer may have a high etch selectivity with respect to an oxide layer when etched with a phosphoric acid solution, whereas an oxide layer may have a high etch selectivity with respect to a nitride layer when etched with a hydrofluoric acid, sulfuric acid, SC-1, or LAL solution.

Figure 4A:
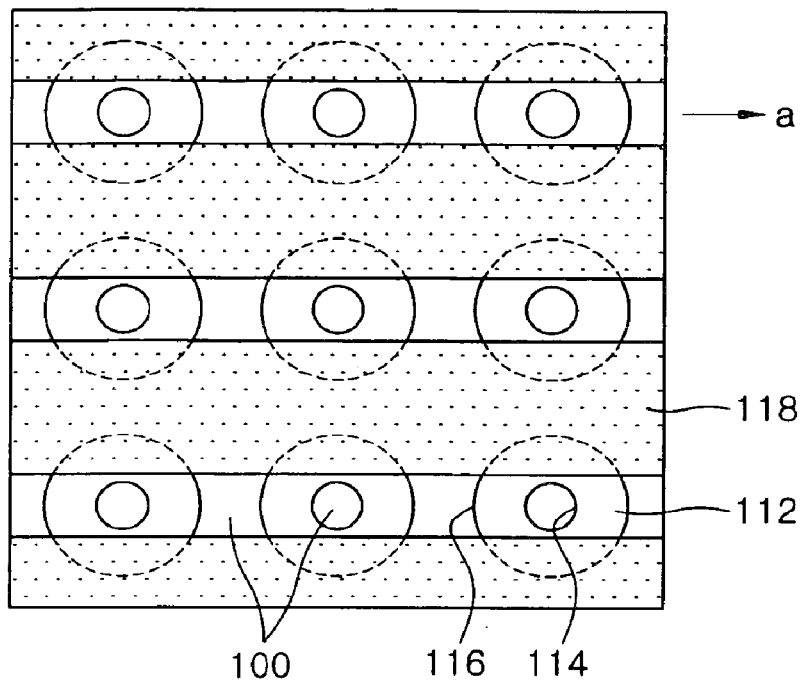
Figure 4B:
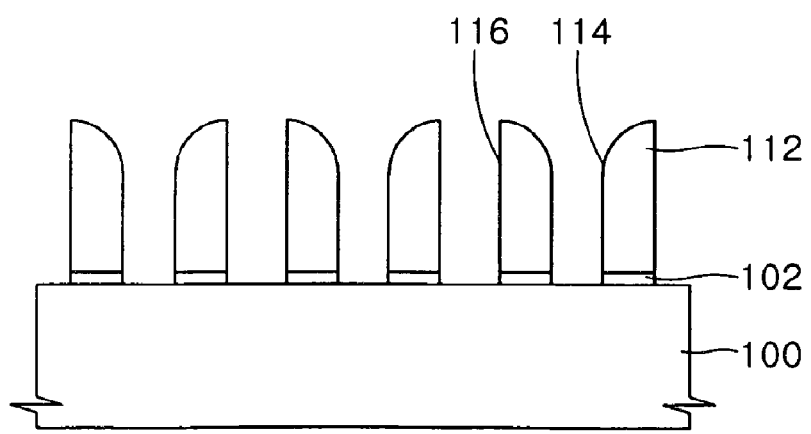

Referring to FIGS. 4A and 4B, a second photoresist pattern 118 in the form of a series of line-shaped openings is formed on the interlayer insulating layer 104. The line-shaped openings extend in a first direction 'a' and expose portions of the first spacer 112 and the interlayer insulating layer 104. The width of a line-shaped opening of the second photoresist pattern 118 may be less than the diameter of the first spacers 112 such that the line-shaped opening extends across only middle portion of the first spacers 112. Furthermore, a line-shaped opening of the second photoresist pattern 118 is preferably wide enough to expose the entirety of each second contact hole 114. Then, the portions of the interlayer insulating layer 104 interposed between the first spacers 112 are removed using the second photoresist pattern 118 as an etch mask, thereby forming third contact holes 116.

Figure 5A:
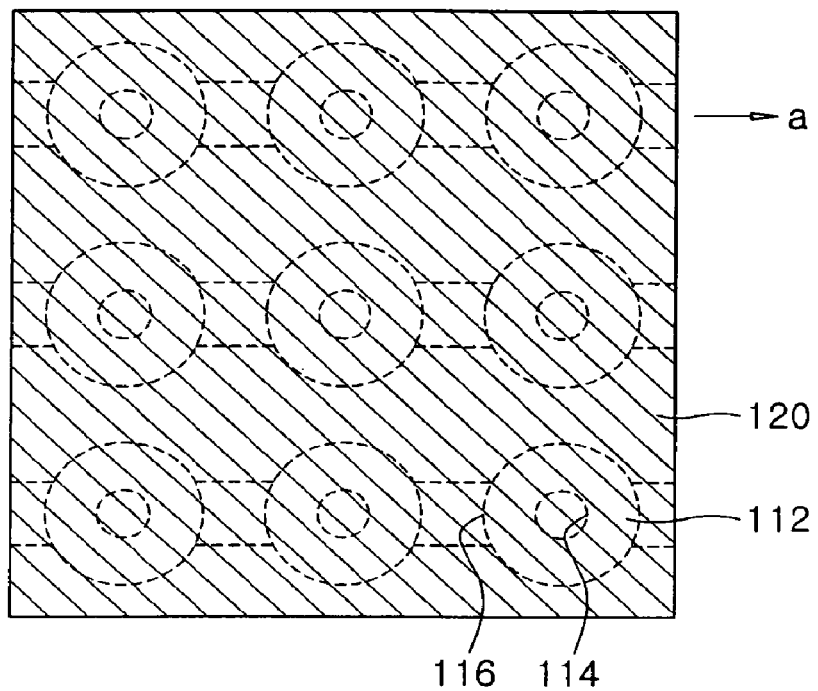
Figure 5B:
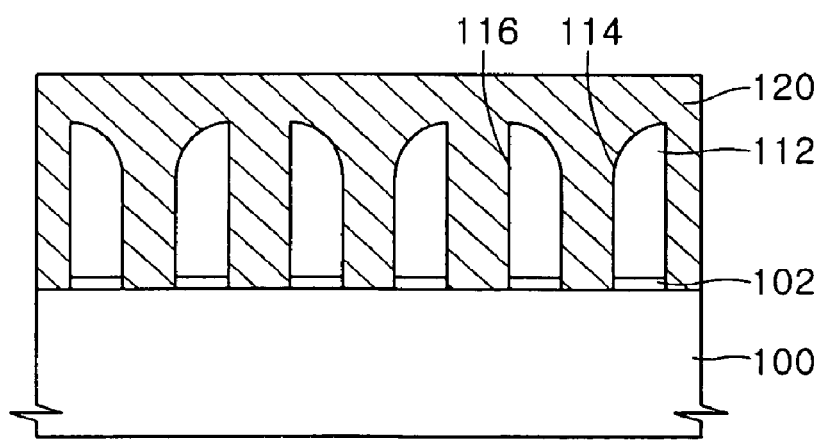

Referring to FIGS. 5A and 5B, a layer 120 of conductive material is formed on the interlayer insulating layer 104 to bury the second contact hole 114 and the third contact hole 116. The conductive material may be polysilicon, tungsten, copper, or aluminum. The layer 120 of conductive material may be formed by an atomic layer deposition method, CVD or PVD.

Figure 6A:
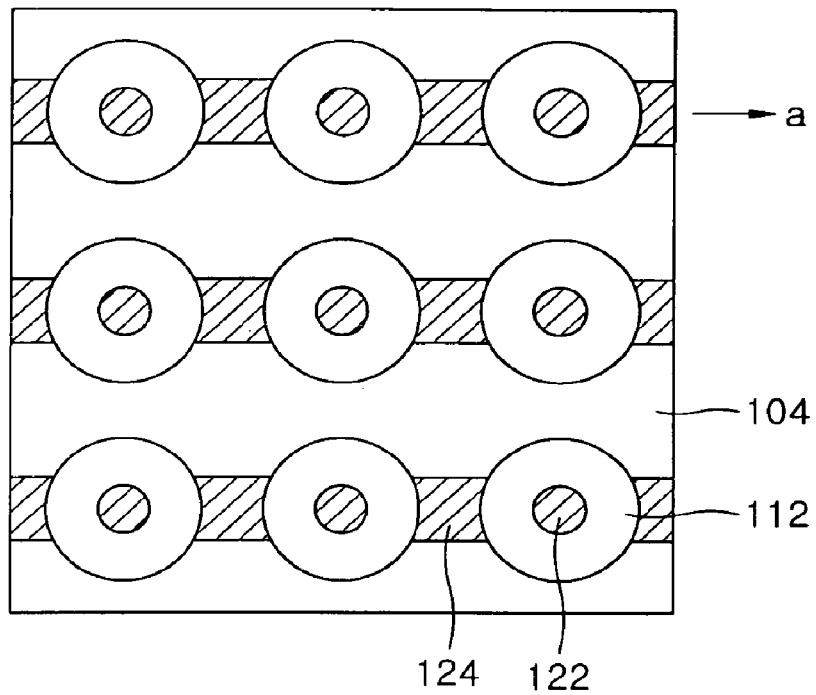
Figure 6B:
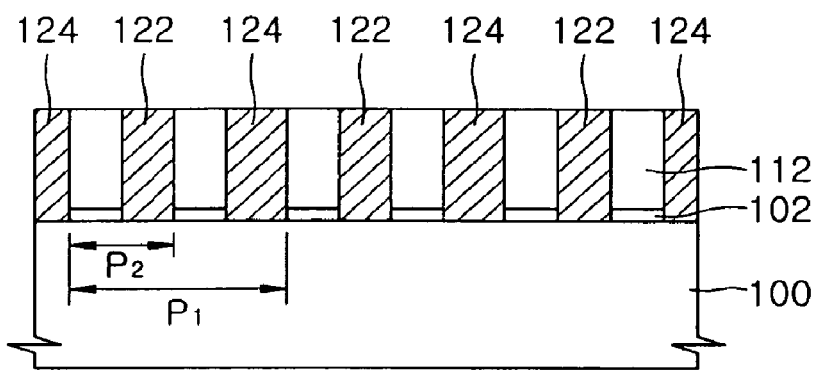

Referring to FIGS. 6A and 6B, the conductive material layer 120 is planarized using a CMP or etch-back process to separate the portions of the layer 120 that are buried in the second contact hole 114 and the third contact hole 116, thereby forming first contacts 122 and second contacts 124. At this time, the first contacts 122 and the second contacts 124 are alternately disposed in one or more rows, as best seen in FIG. 6B. As was mentioned above, the diameter of the first contact holes 106 (FIG. 2) is three times the width of the second contacts 124 as taken in the longitudinal direction of the row, i.e., along the first direction 'a'. Also, the width of the first contact 122 is dictated by the thickness to which the first spacer 112 is formed. Thus, if the first spacer 112 is formed to a thickness that will equal the width of the second contact 124, the first contact 122 and the second contact 124 aligned therewith in the first direction 'a' will have the same width. If the first spacer 112 is formed to a thickness that will be greater than the width of the second contact 124, the width of the first contact 122 will be smaller than the width of the second contact 124. On the contrary, if first spacer 112 is formed to a thickness that will be smaller than the width of the second contact 124, the width of the first contact 122 will be greater than the width of the second contact 124.

According to the first embodiment of the present invention, a contact is formed in the region where portions of the interlayer insulating layer 104 extending between the first spacers 112 are removed. Thus, the pitch $P_2$ of the contacts is half of the pitch $P_1$ of the contact holes 106 that are formed using a typical photolithographic technique.

Second Embodiment

This embodiment is intended to prevent the regions of the substrate 100 exposed by the second contact holes 114 from being damaged when the third contact holes 116 are being formed.

Figure 7A:
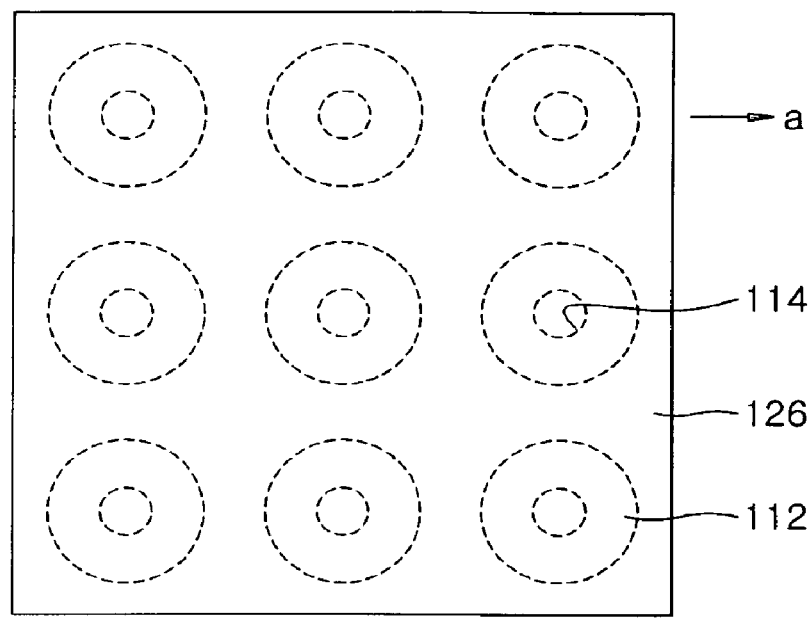
Figure 7B:
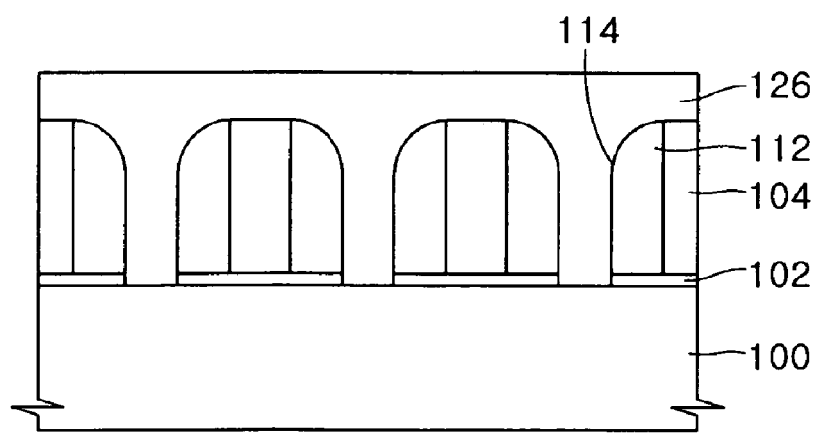

Referring to FIGS. 7A and 7B, an insulating layer 126 having a good gap-filling property is formed to fill the second contact holes 114 before the third contact holes 116 are formed. The insulating layer 126 may be an SOG layer, a layer of hydrogen silsesquiozane (HSQ), a field oxide layer, or an inorganic SOG layer of the polysilazane group (TOSZ layer). The insulating layer 126 can be formed using a spin-coating method because the material of the insulating layer 126 has high mobility.

Figure 8A:
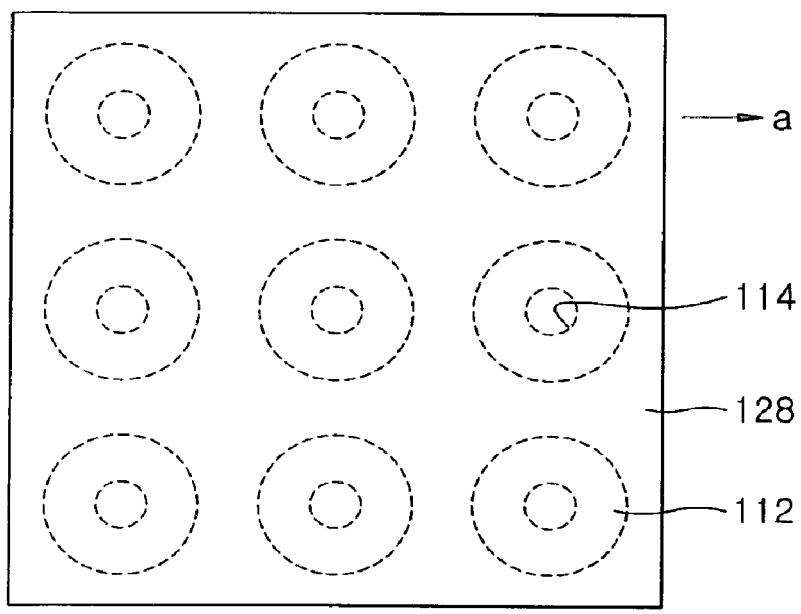
Figure 8B:
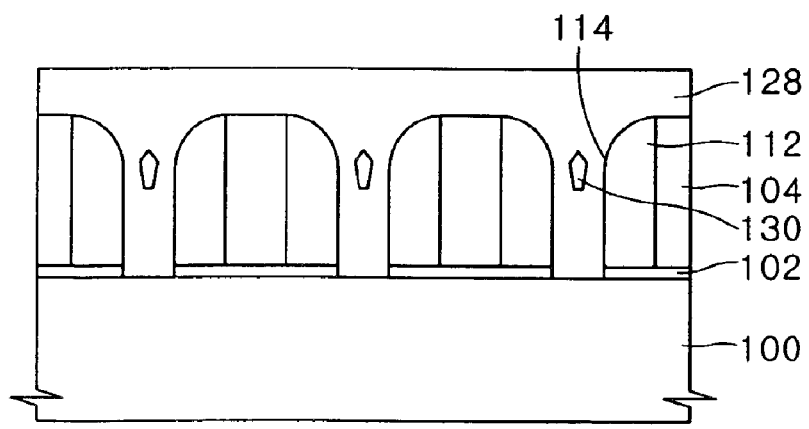

Alternatively, as shown in FIGS. 8A and 8B, the second contact holes 114 can be filled with a CVD oxide layer 128 before the third contact holes 116 are formed. The CVD oxide layer 128 may be a USG, PE-Oxide or PE-TEOS layer. Note, reference numeral 130 designates voids that may be produced inside the CVD oxide layer 128 as CVD oxide layers do not have an excellent gap-filling property.

According to the second embodiment of the present invention, the insulating or CVD oxide layer 126 or 128 prevents the substrate 100 from being damaged while the third contact holes 116 are being formed. The insulating or CVD oxide layer 126 or 128 is removed with portions of the interlayer insulating layer 104 during the process of forming the third contact holes 116.

Third Embodiment

In this embodiment, a photoresist pattern 132 having a series of discrete contact-shaped openings is formed instead of the photoresist pattern 118 having a series of line-shaped openings.

Figure 9A:
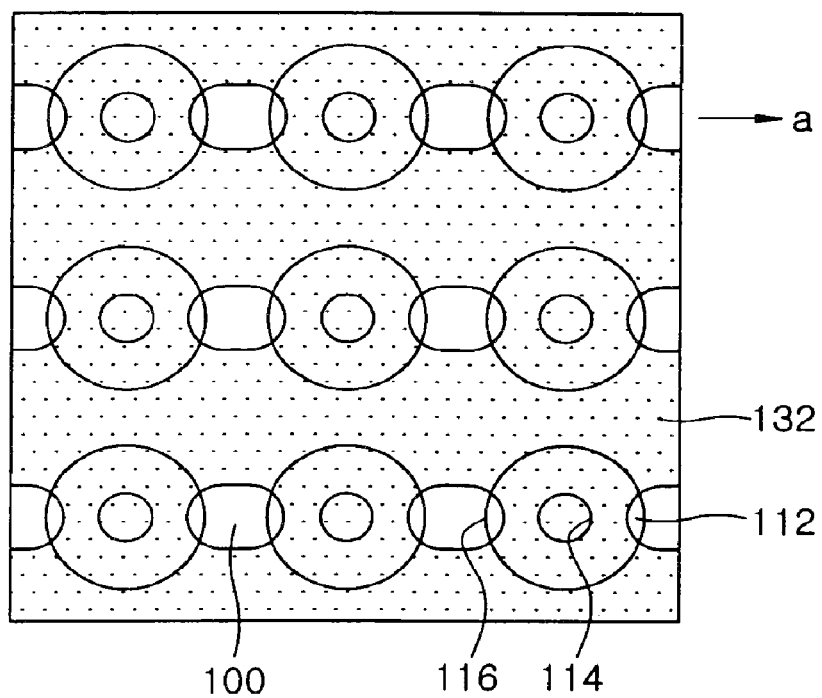
Figure 9B:
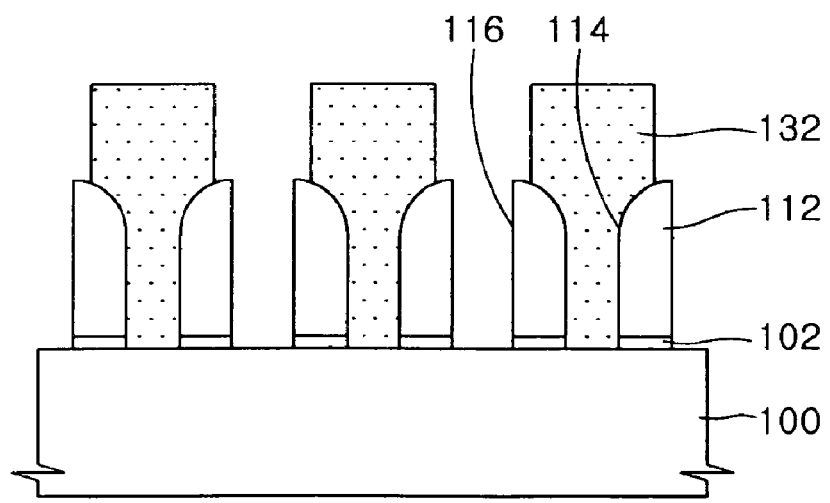

Referring to FIGS. 9A and 9B, the contact-shaped openings of the photoresist pattern 132 expose portions of the interlayer insulating layer 104 at both sides of the first spacer 112 with respect to the first direction 'a'. Then, the portions of the interlayer insulating layer 104 exposed at both sides of the first spacer 112 are removed, using the photoresist pattern 132 as an etch mask, to form the third contact holes 116.

According to the third embodiment of the present invention, the second contact holes 114 are occupied by the third photoresist pattern 132 during the forming of the third contact holes 116. Thus, regions of the substrate 100 at the bottom of the second contact holes 114 are prevented from being damaged during the process of forming the third contact holes 116.

Fourth Embodiment

Figure 10A:
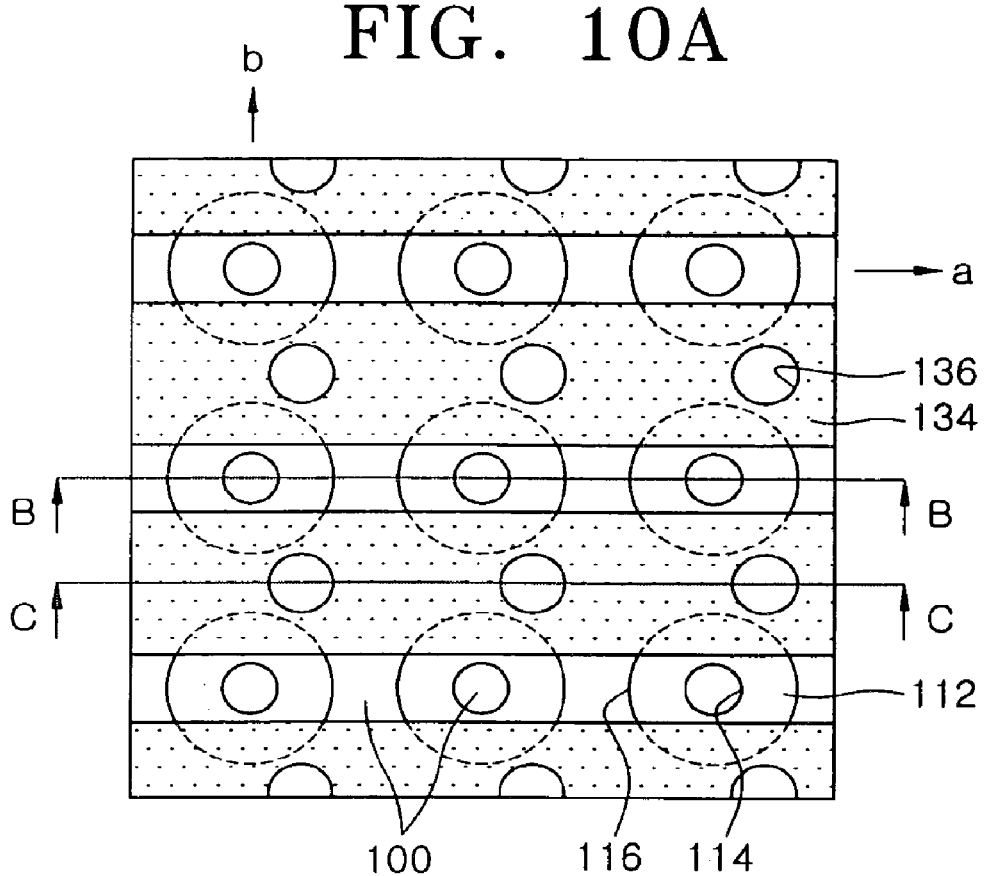
Figure 10B:
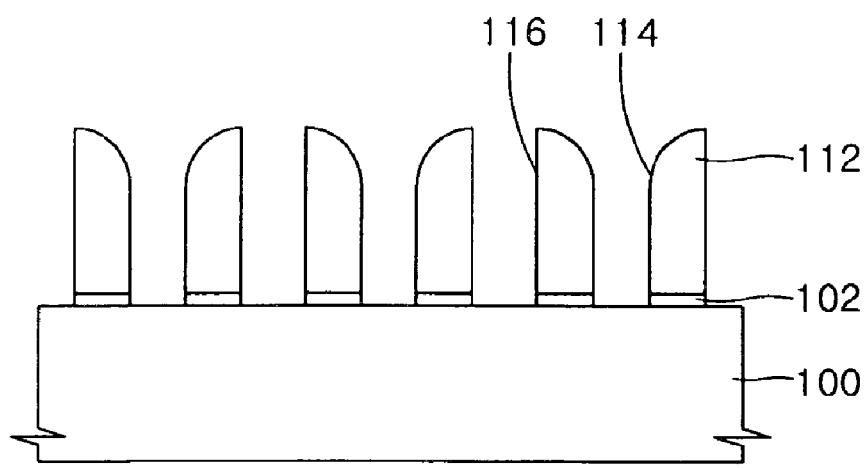
FIGS. 10B and 11B are corresponding sectional views of the structure during the course of its manufacture as taken in a first direction.
Figure 10C:
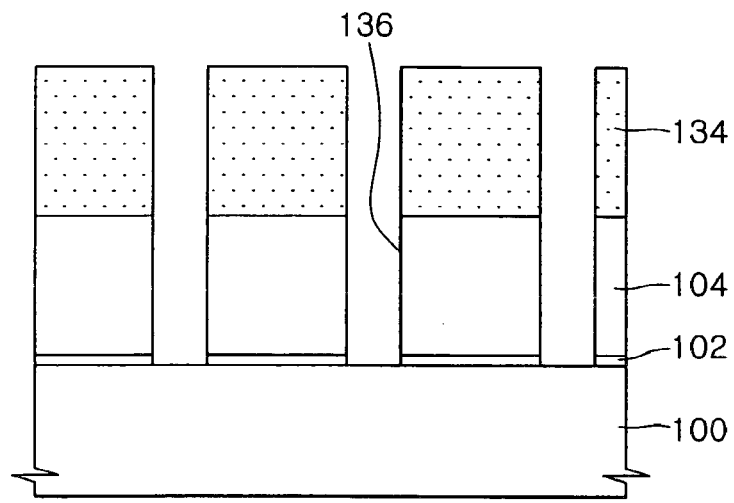
Figure 11A:
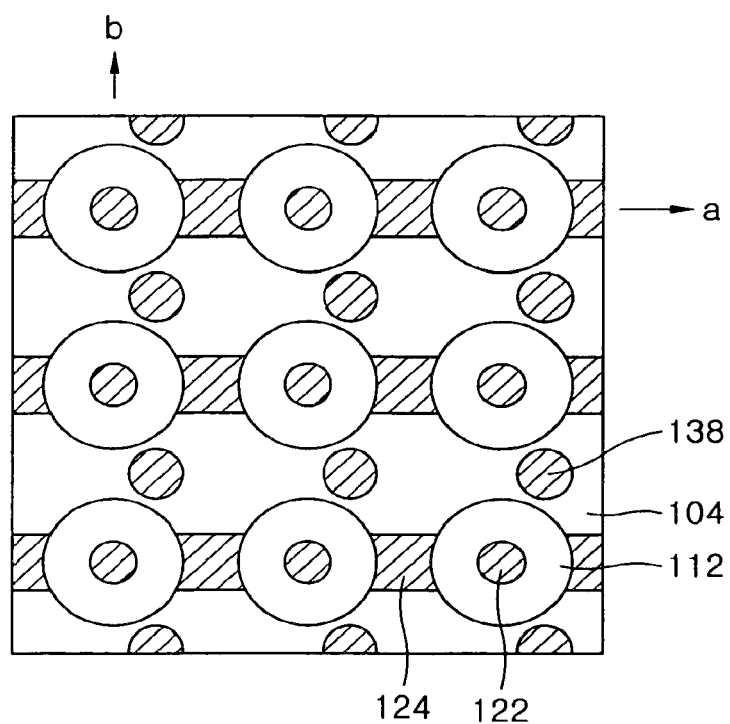
Figure 11B:
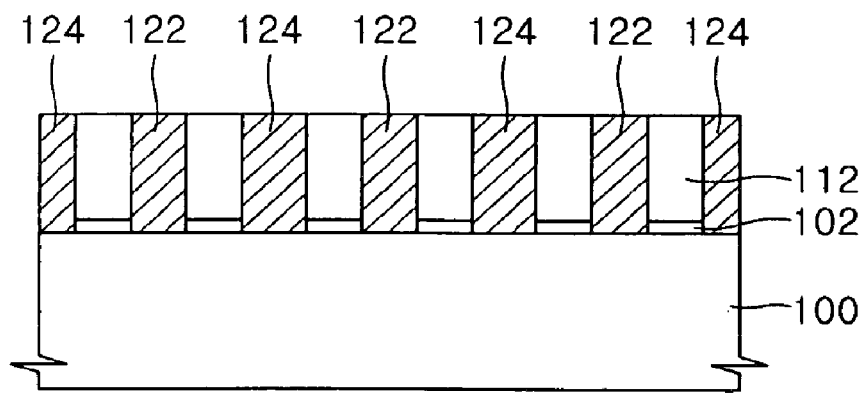
Figure 11C:
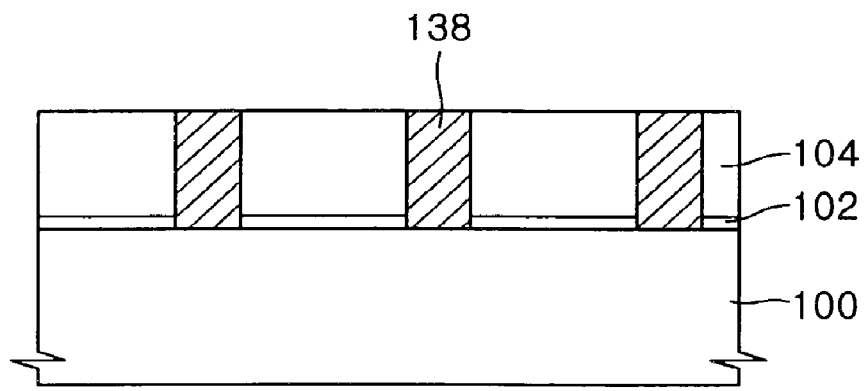

FIGS. 10A through 11C illustrate a fourth embodiment of the present invention. In these figures, line B-B of FIG. 10A shows the first direction in which the sectional views of FIGS. 10B and 11B are taken. Line C-C of FIG. 10A shows the second direction in which the sectional views of FIGS. 10C and 11C are taken. In this embodiment, first and second contacts are formed in the interlayer insulating layer 104 in a row(s) extending in the first direction 'a' as in the previous embodiments. However, third contacts are also formed in the interlayer insulating layer 104 in a row(s) extending in a second direction 'b' that is perpendicular to the first direction 'a'. In these Referring to FIGS. 10A through 11C, a photoresist pattern 134 having a series of line-shaped and contact-shaped openings is formed on the interlayer insulating layer 104 to expose an upper surface of the interlayer insulating layer 104. The line-shaped openings extend in the first direction 'a' parallel to each other. The contact-shaped openings are aligned with each other in one or more rows, with each row of aligned contact-shaped openings extending in the second direction 'b'. Then, the portions of the interlayer insulating layer 104 interposed between the first spacers 112 and exposed by the line-shaped openings of the photoresist pattern 134 are removed using the photoresist pattern 134 as an etch mask, thereby forming the third contact holes 116. At the same time, the portions of the interlayer insulating layer exposed by the contact-shaped openings are removed using the photoresist pattern as an etch mask, thereby forming fourth contact holes 136. The fourth contact holes 136 are filled with conductive material at the same time as the third contact holes 116, thereby forming a third set of contacts 138.

Note, although this embodiment has been described with respect to the use of a photoresist pattern 134 having both a series of line-shaped openings as described with respect to the photoresist pattern 118 of the first embodiment, and contact-shaped openings, the present invention is not so limited. Rather, this embodiment of the present invention may be implemented by sequentially forming first and second photoresist patterns on the interlayer insulating layer 104, with one of the photoresist patterns having the line-shaped openings and the other of the photoresist patterns having the contact-shaped openings. In this case, the interlayer insulating layer may be etched using the first photoresist pattern as an etch mask to form the third contact holes 116 or the fourth contact holes 136. Then the first photoresist pattern is removed, the second photoresist pattern is formed on the interlayer insulating layer 104, and the interlayer insulating layer 104 is etched using the second photoresist pattern as an etch mask to form the fourth contact holes 136 or the third contact holes 116.

According to the fourth embodiment of the present invention, contacts which are aligned along the first direction 'a' and contacts which are aligned along the second direction 'b' can be formed. Also, as is best seen in FIG. 11A, contacts can be easily formed as lying along a zigzagging path, i.e., along a path the zigzags about a straight line extending in the direction 'b' in the fourth embodiment. Thus, the fourth embodiment of the present invention can be used to form a structure that has both contacts for capacitor lower electrodes and bit line contacts.

Fifth Embodiment

Figure 12A:
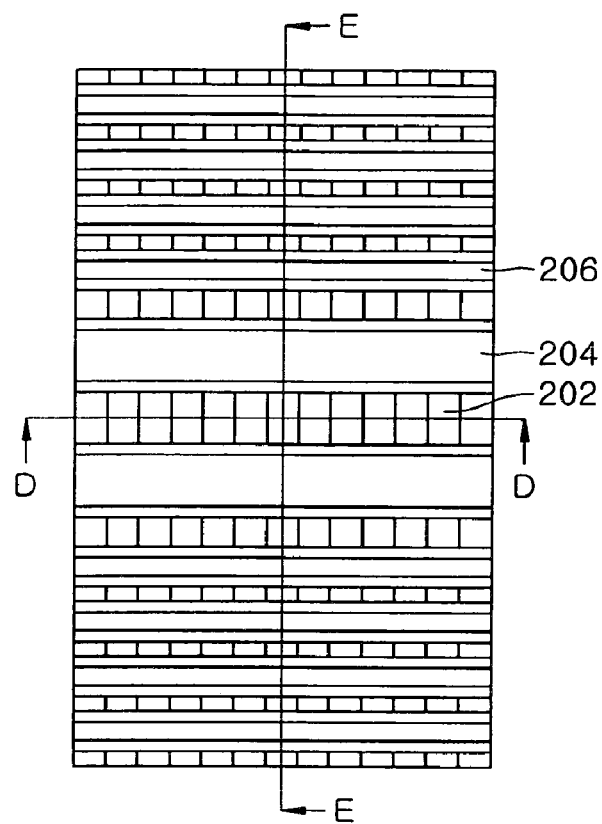
FIGS. 12A through 20B illustrate a fifth embodiment of a method of forming a contact structure according to the present invention, wherein FIGS. 12A, 13A . . . 20A are plan views and FIGS. 12B, 13B . . . 20B are corresponding sectional views of the structure during the course of its manufacture as taken in a first direction, and FIGS. 12C, 13C . . . 20C are corresponding sectional views of the structure during the course of its manufacture as taken in a second direction perpendicular to the first direction.

FIGS. 12A through 20C illustrate a fifth embodiment of the present invention. In these figures, line D-D of FIG. 12A shows the direction along which the sectional views of FIGS. 12B, 13B . . . 20B are taken, and line E-E of FIG. 12A shows the direction along which the sectional views of FIGS. 12C, 13C . . . 20C are taken. In this embodiment, a method of forming a fine contact will be described in connection with a flash memory.

Figure 12B:
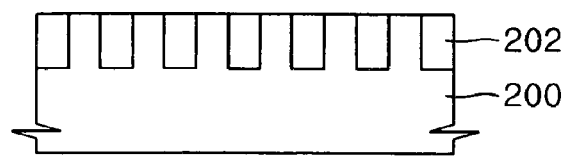
Figure 12C:
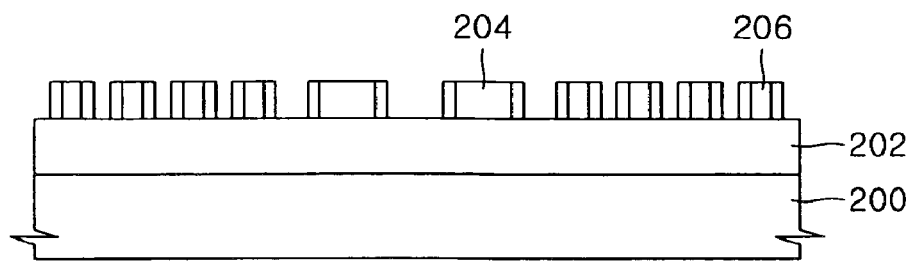

Referring first to FIGS. 12A through 12C, a semiconductor substrate 200 having a conductive region 202, for example, an active region, is prepared. Then, a first gate line 204 and a second gate line 206 having different widths are formed on the semiconductor substrate 200. For example, the first gate line 204 may be a select gate line and the second gate line 206 may be a drive gate line of a flash memory. Generally, the width of the select gate line 204 is greater than the width of the drive gate line 206 in a flash memory. Also, although not shown in detail in the drawings, the first and second gate lines 204, 206 may have structures typical of gate lines. For example, each of the gate lines 204, 206 may comprise a gate insulating layer, a floating gate, and a control gate, which are sequentially stacked one atop the other, and spacers formed on the sidewalls of the stacked structure.

Figure 13A:
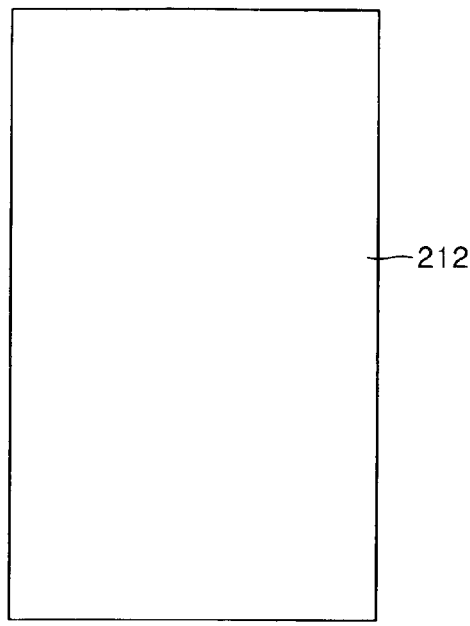
Figure 13B:
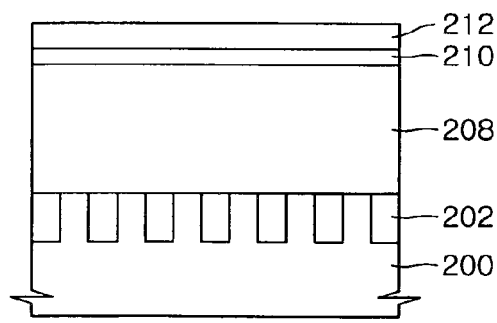
Figure 13C:
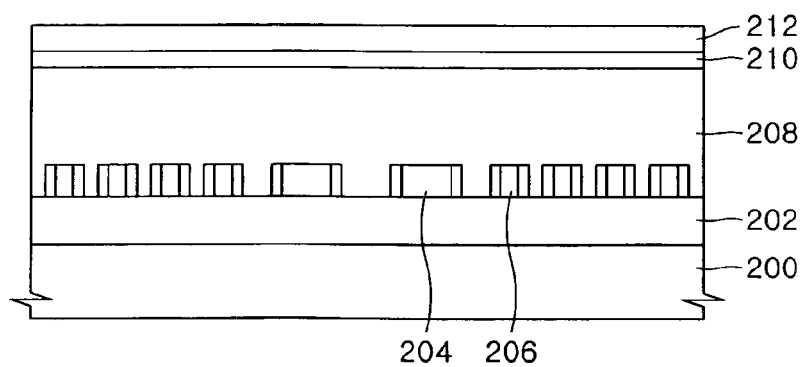

Referring to FIGS. 13A through 13C, a first interlayer insulating layer 208 is formed on the semiconductor substrate 200 to cover the first gate line 204 and the second gate line 206. The first interlayer insulating layer 208 may be of a low-k dielectric material, for example, silicon oxide. A second etch stop layer 210 and a second interlayer insulating layer 212 are formed on the first interlayer insulating layer 208. However, in some cases, the second etch stop layer 210 and the second interlayer insulating layer 212 may be omitted.

Figure 14A:
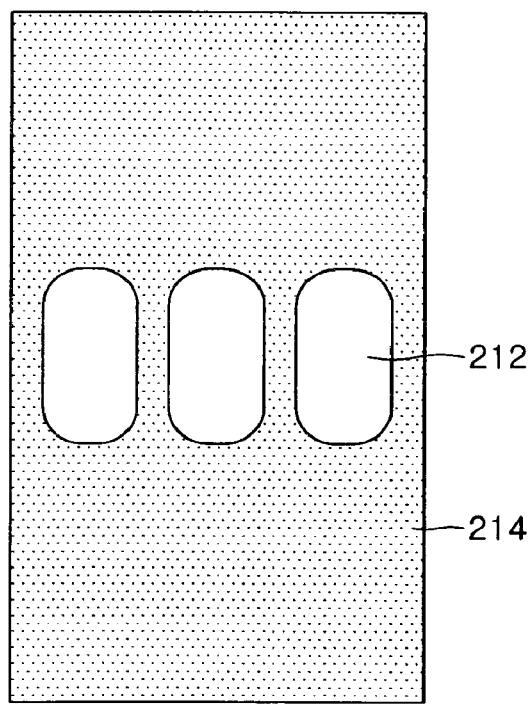
Figure 14B:
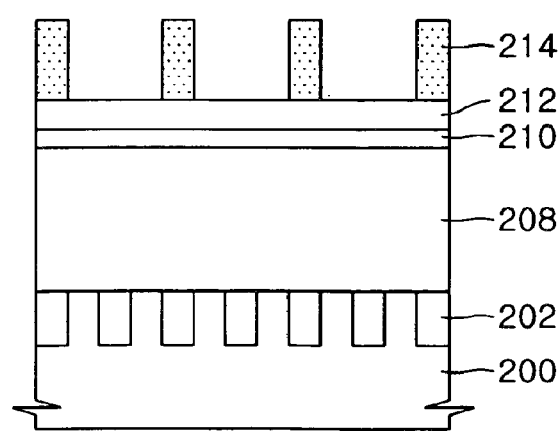
Figure 14C:
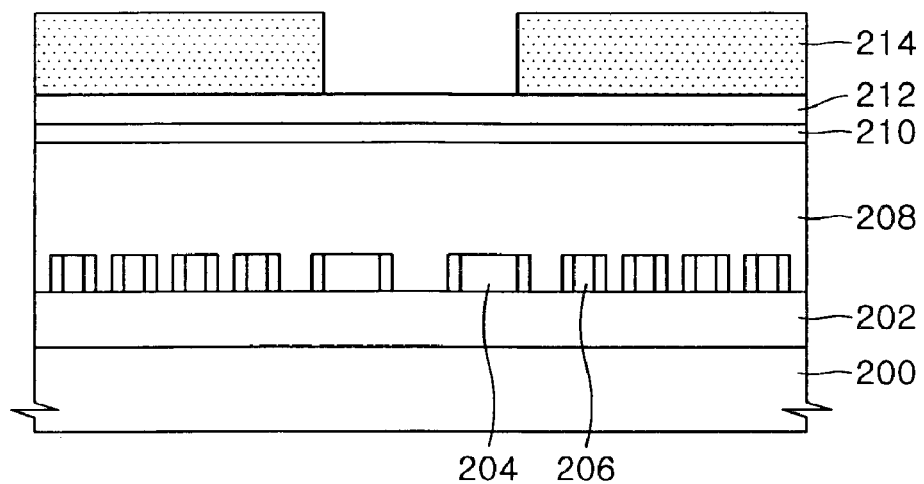

Referring to FIGS. 14A through 14C, a first photoresist pattern 214 having a series of contact-shaped openings is formed on the second interlayer insulating layer 212.

Figure 15A:
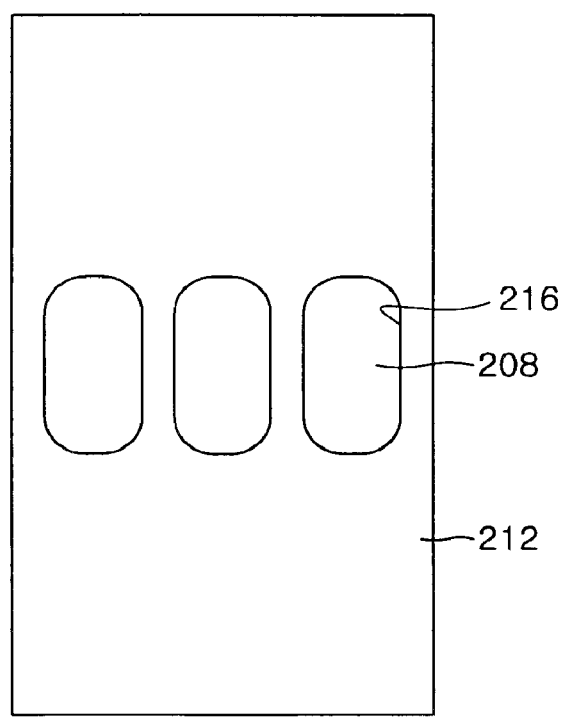
Figure 15B:
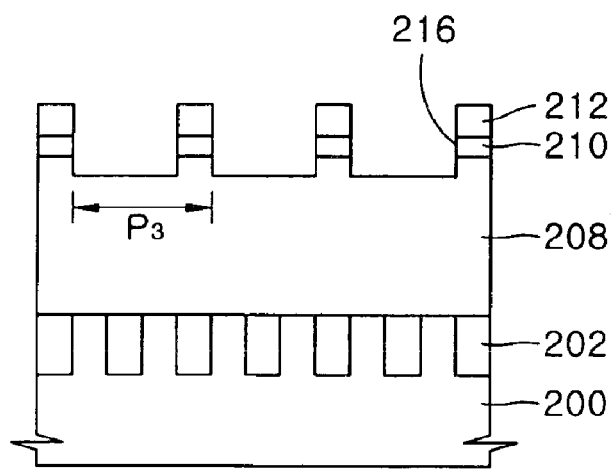
Figure 15C:
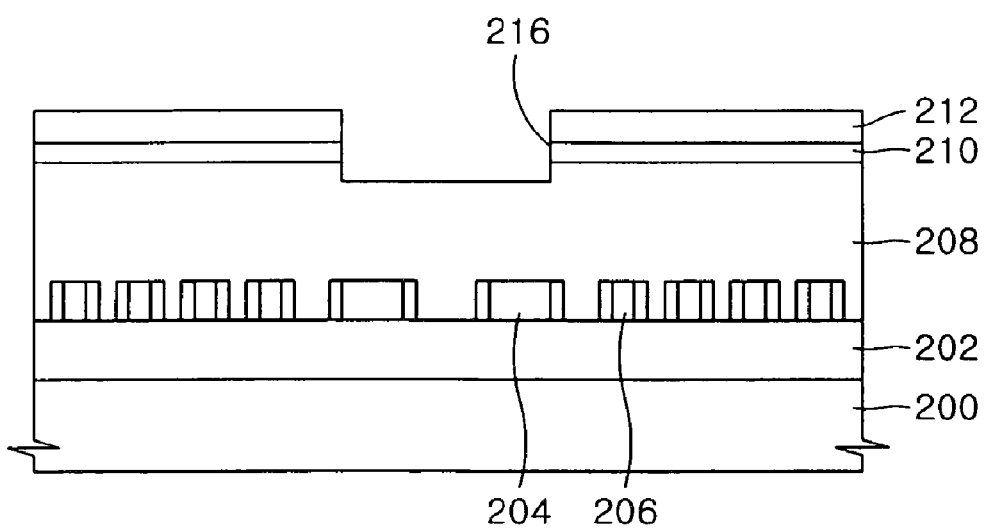

Referring to FIGS. 15A through 15C, portions of the second interlayer insulating layer 212, the second etch stop layer 210, and the first interlayer insulating layer 208 are removed, using the first photoresist pattern 214 as an etch mask, to form first contact holes 216. The pitch $P_3$ of the first contact holes 216 is relatively large.

Figure 16A:
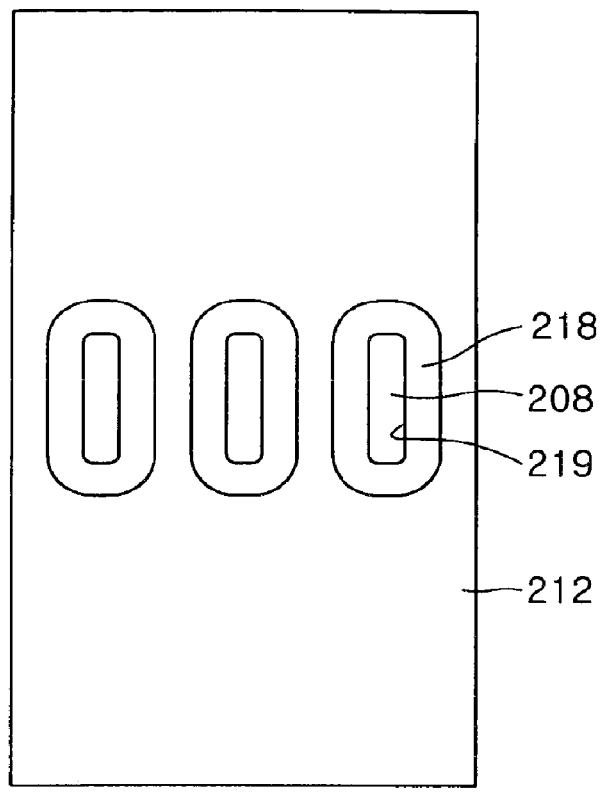
Figure 16B:
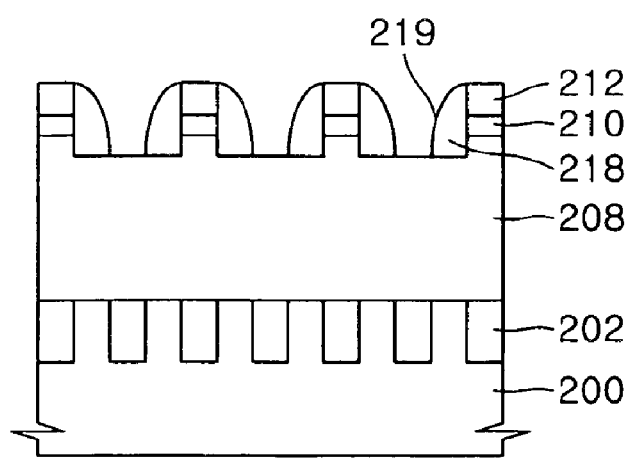
Figure 16C:
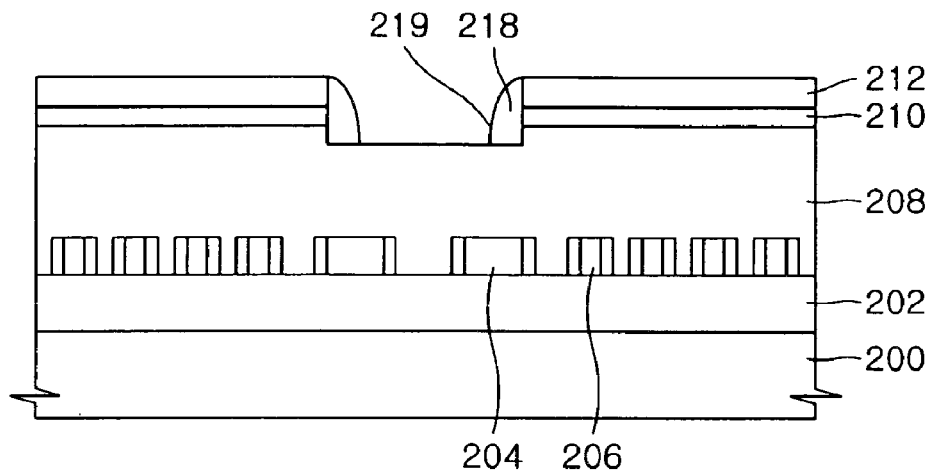

Referring to FIGS. 16A through 16C, a layer of first spacer material is formed over the second interlayer insulating layer 212 using a blanket deposition method to conform to the topology presented by the second interlayer insulating layer 212, the second etch stop layer 210, and the first interlayer insulating layer 208. Then, the layer of first spacer material is etched to form first spacers 218 along the sides of the first contact holes, and second contact holes 219 that expose the interlayer insulating layer 208.

Figure 17A:
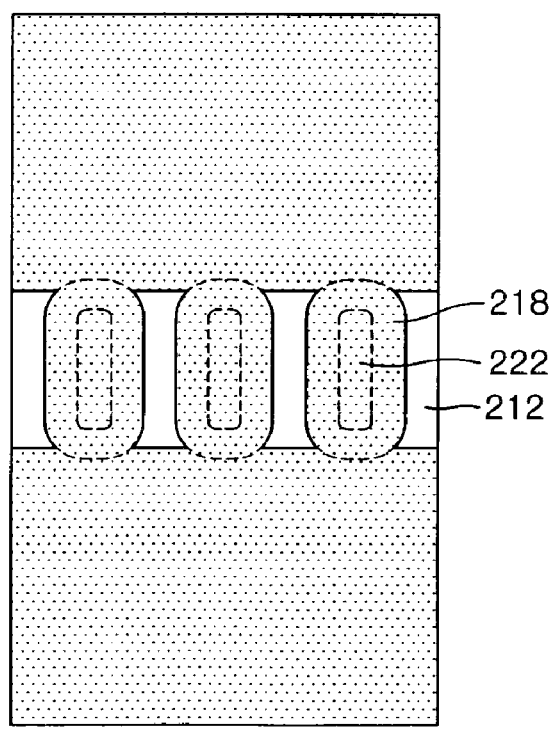
Figure 17B:
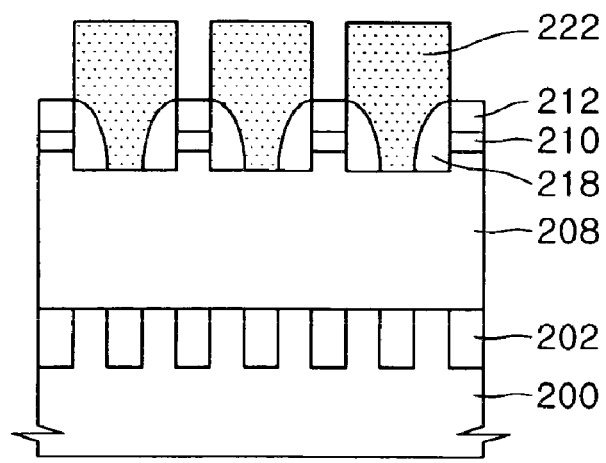
Figure 17C:
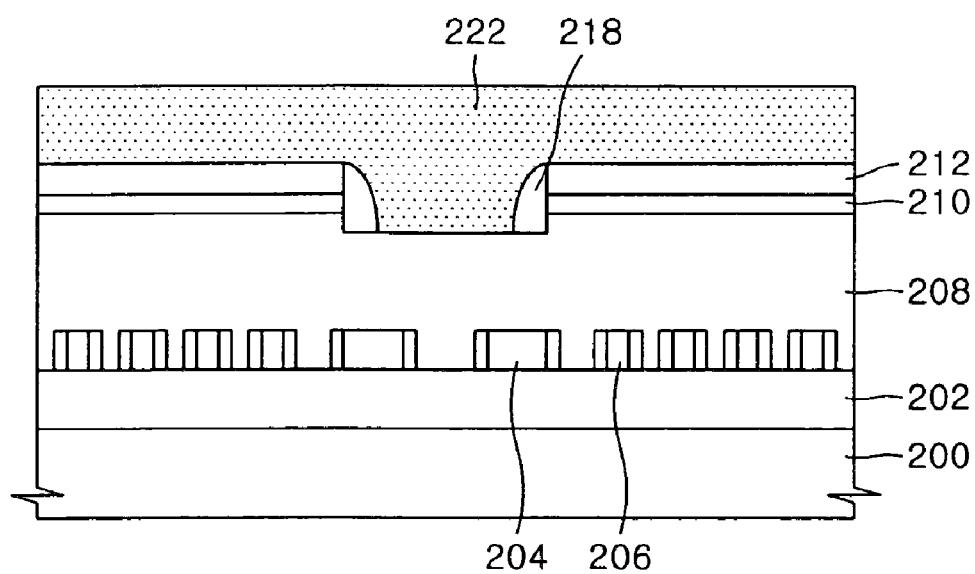

Referring to FIGS. 17A through 17C, a second photoresist pattern 222 is formed to expose the portions of the second interlayer insulating layer 212 extending between the first spacers 218. Then, the exposed portions of the second interlayer insulating layer 212 are etched using the second photoresist pattern 222 as an etch mask. The etching is controlled by the etch stop layer 210. Then, the second photoresist pattern is removed.

Figure 18A:
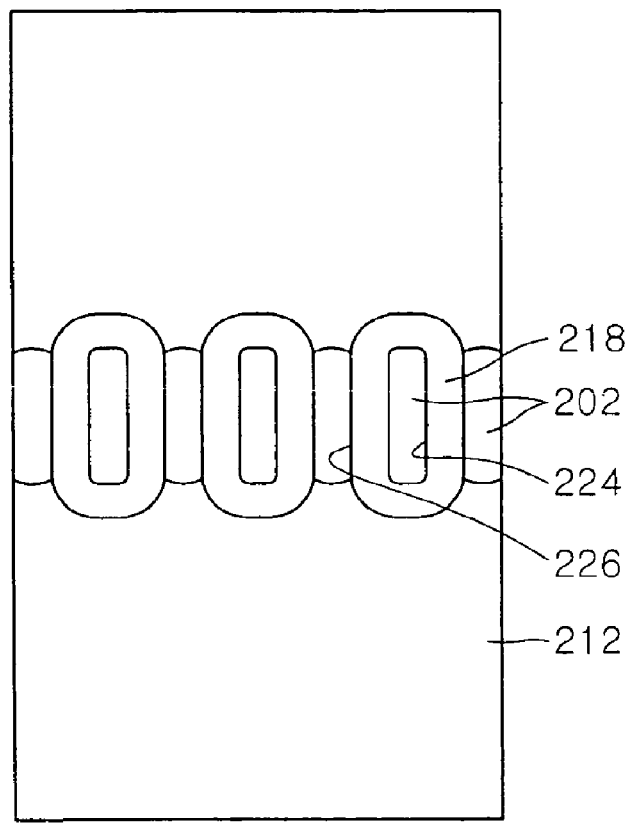
Figure 18B:
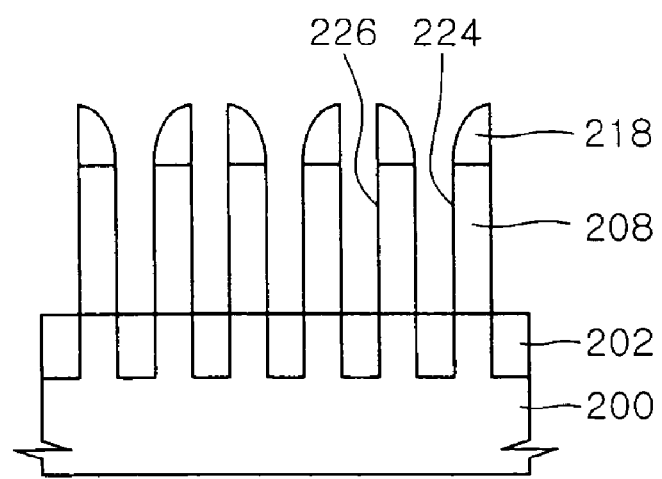
Figure 18C:
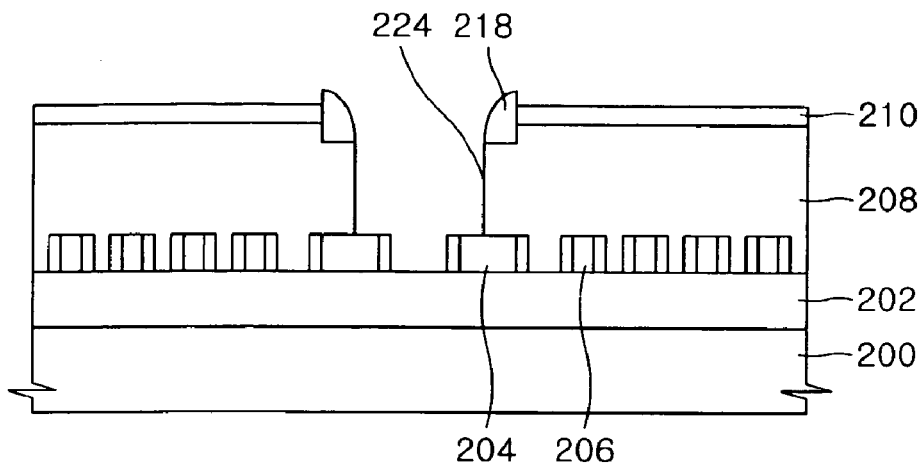

Referring to FIGS. 18A through 18C, the structure is etched to extend the second contact holes 219 downward, thereby forming third contact holes 224 that expose the semiconductor substrate 200. At the same time, the portions of the first interlayer insulating layer 208 extending between the first spacers 218 are removed, thereby forming fourth contact holes 226 that also expose the semiconductor substrate 200.

Figure 19A:
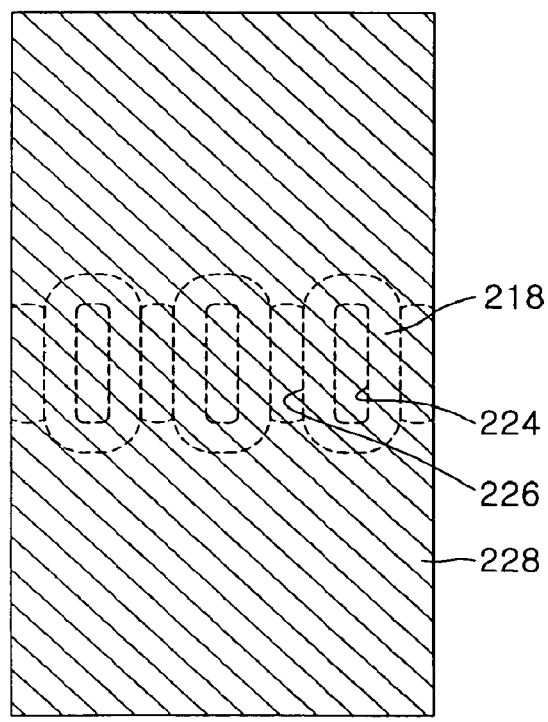
Figure 19B:
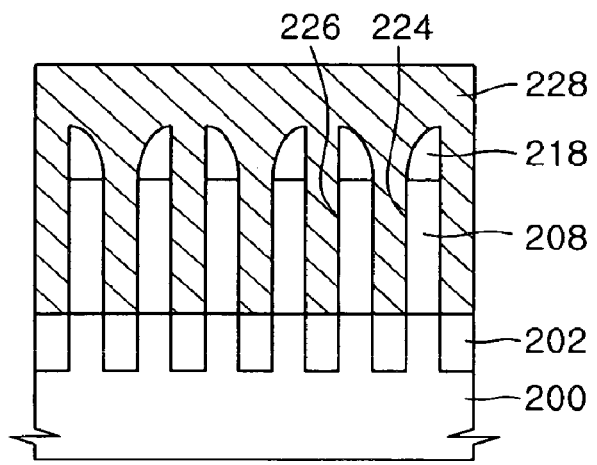
Figure 19C:
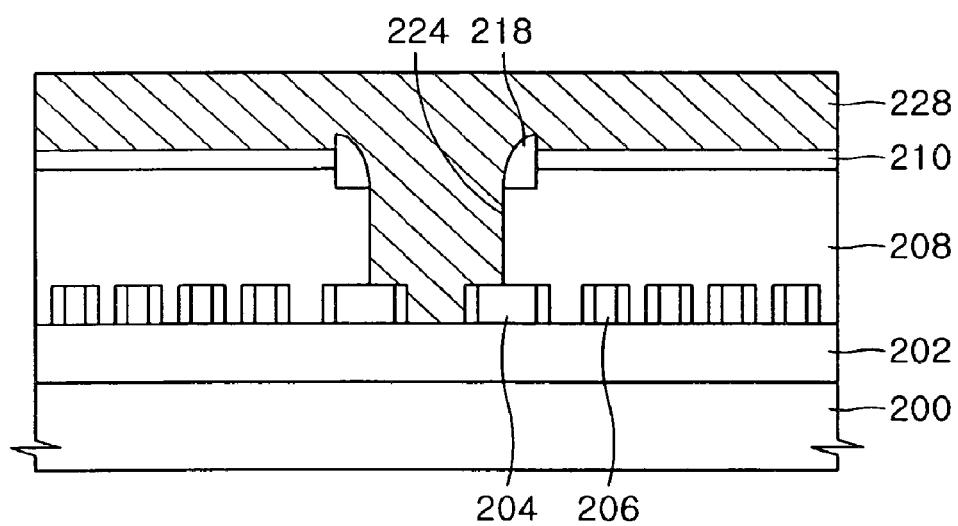

Referring to FIGS. 19A through 19C, a layer 228 of conductive material is formed on the first interlayer insulating layer 208 by a deposition process to bury the third contact holes 224 and the fourth contact holes 226. Specifically, the layer 228 conductive material may be formed by atomic layer deposition, CVD or PVD. The conductive material of layer 228 may be polysilicon, tungsten, copper, or aluminum.

Figure 20A:
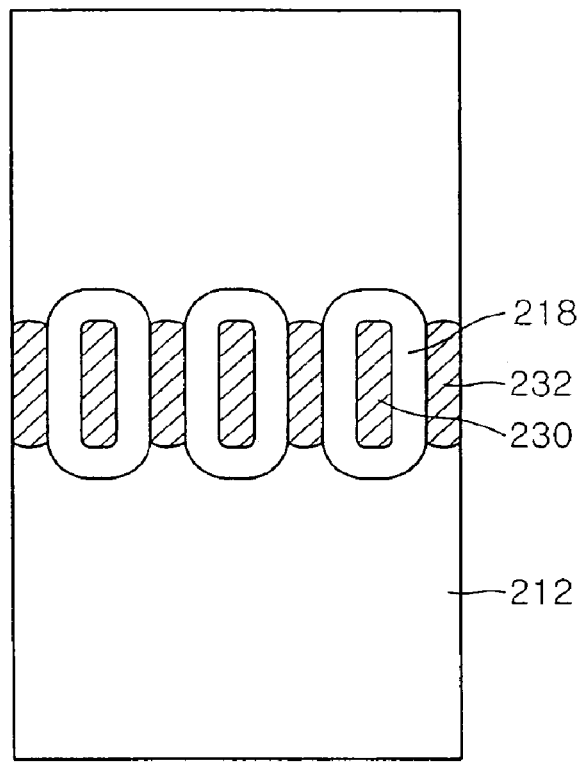
Figure 20B:
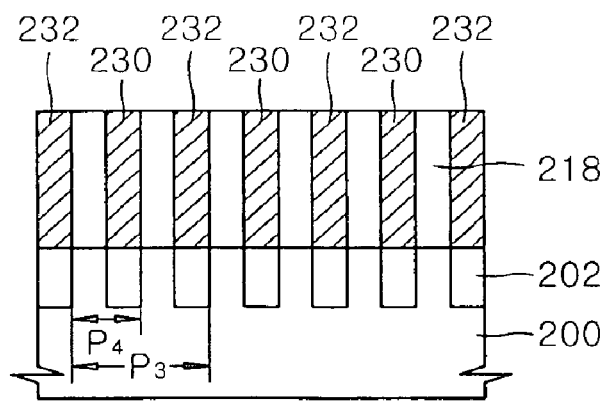
Figure 20C:
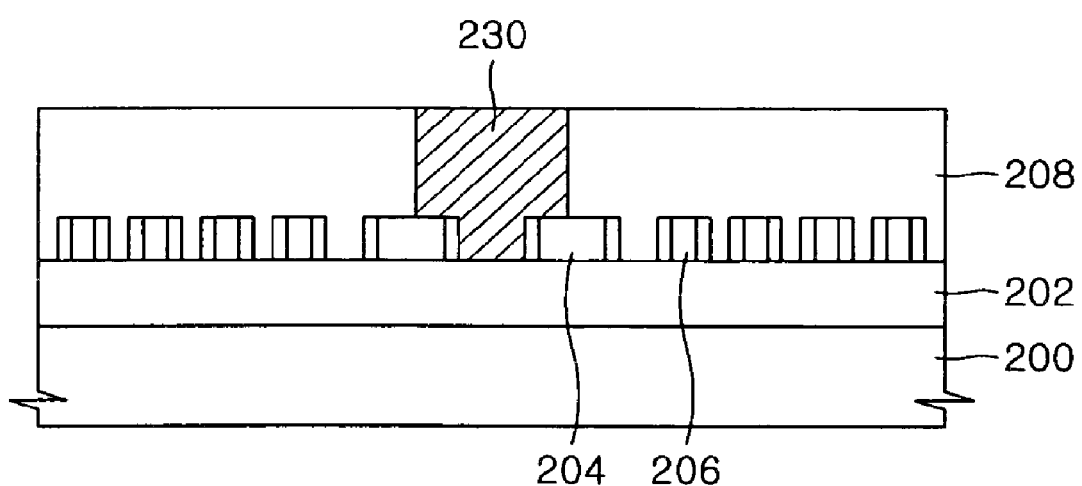

Referring to FIGS. 20A through 20C, the layer 228 of conductive material is planarized using a CMP or etch-back process to separate portions of the conductive material layer 228 inside the third contact holes 224 from portions of the conductive material layer 228 inside the fourth contact holes 226, thereby forming first contacts 230 and second contacts 232. At this time, the first contacts 230 and the second contacts 232 are alternately disposed in a row. Preferably, the width of the first contact hole 216 (FIGS. 15A and 15B) is three times the width of the first contact 230 in the direction in which the contacts 230, 232 are aligned. The width of the first contacts 230 is dictated by the thickness to which the first spacer 218 is formed. In this case, the pitch $P_4$ of the contacts 230, 232 is half the original pitch $P_3$ of the first contact holes 216, i.e., the contact holes that are formed by a typical photolithographic technique.

Also, according to the fifth embodiment of the present invention, the first spacers 218 and the second etch stop layer 210 are not present during the process of forming the first contacts 230 and the second contacts 232. Therefore, this process can be performed without being affected by the permeability of the first spacers 218 and the second etch stop layer 210.

The method of forming a contact structure of a semiconductor device according to the present invention does not require a chemical attack process (CAP) or a photoresist flow process, which have been conventional in the forming of fine contacts. Furthermore, contacts having a uniform size can be formed throughout the entire cell region according to the present invention, unlike a conventional method in which dummy contacts formed at the outer periphery of the cell region are enlarged. That is, the first spacers protect all of the portions of the cell region where the contacts will be formed. Thus, contacts can be simultaneously formed in the middle of the cell region and at the outer periphery of the cell region.

Also, according to the present invention as described above, spacers are formed over the sidewalls of contact holes in an interlayer insulating layer. As a result, the pitch of the contacts (first and second) ultimately formed in the interlayer insulating layer can be half the pitch of the contact holes themselves.

Still further, (third) contacts can be formed in the interlayer insulating layer as arrayed in a second direction skewed relative to a first direction in which (first and second) contacts having a fine pitch are aligned. Thus, the present invention can be used to form the contact structures of various types of semiconductor devices.

Finally, although the present invention has been particularly shown and described with reference to the preferred embodiments thereof, various changes may be made to the preferred embodiments without departing from the true spirit and scope of the present invention as defined by the following claims.

What is claimed is:

1. A method of forming contact structure of a semiconductor device, comprising:
    providing a substrate having a conductive region;
    forming an interlayer insulating layer on the substrate;
    forming first contact holes in the interlayer insulating layer;
    forming first spacers that cover the sides of the first contact holes, respectively, and leave second contact holes therein;
    removing the interlayer insulating layer from between the first spacers, thereby forming at least one third contact hole; and
    filling the second contact holes and the at least one third contact hole with conductive material, thereby forming first contacts in the second contact holes, respectively, and a respective second contact in each said at least one third contact hole, wherein the first and second contacts are aligned and alternately disposed in a row in a first direction.

2. The method according to claim 1, further comprising forming a first etch stop layer between the substrate and the interlayer insulating layer.

3. The method according to claim 1, wherein the forming of the first contact holes comprises:
    forming a first photoresist pattern on the interlayer insulating layer; and
    etching the interlayer insulating layer using the first photoresist pattern as an etch mask.

4. The method according to claim 1, wherein the forming of the first spacers and the second contact holes within the first contact holes comprises:
    depositing a layer of first spacer material over the bottoms and sides of the first contact holes; and
    etching the layer of first spacer material.

5. The method according to claim 4, further comprising filling the second contact holes with a layer of insulating material selected from the group consisting of an SOG layer, an HSQ layer, a field oxide layer and a TOSZ layer, before the at least one third contact hole is formed.

6. The method according to claim 4, further comprising filling the second contact holes with an oxide layer using a CVD method, before the at least one third contact hole is formed.

7. The method according to claim 1, wherein the forming of the at least one third contact hole comprises:
    forming a second photoresist pattern on the interlayer insulating layer, the second photoresist pattern having a line-shaped opening that runs across the first spacers, and exposes the first spacers and each portion of the interlayer insulating layer that extends between adjacent ones of the first spacers in a first direction; and
    etching the interlayer insulating layer using the second photoresist pattern as an etch mask.

8. The method according to claim 1, wherein the forming of the at least one third contact hole comprises:
    forming a second photoresist pattern on the interlayer insulating layer, the second photoresist pattern having a respective contact-shaped opening that exposes each portion of the interlayer insulating layer that extends between adjacent ones of the first spacers in a first direction; and
    etching the interlayer insulating using the third photoresist pattern as an etch mask.

9. The method according to claim 1, further comprising forming a third contact extending through the interlayer insulating layer and spaced from the row of the first and second contacts in a second direction perpendicular to the first direction.

10. The method according to claim 9, wherein the forming of the third contact comprises:
    forming a photoresist pattern on the interlayer insulating layer, the photoresist pattern having a contact-shaped opening that exposes the interlayer insulating layer;
    etching the interlayer insulating layer using the photoresist pattern as an etch mask, thereby forming a fourth contact hole; and
    filling the fourth contact hole with conductive material.

11. A method of forming a semiconductor device, comprising:
    providing a semiconductor substrate having a conductive region, and first gate lines and second gate lines running along the semiconductor substrate and electrically conductively connected to the conductive region of the semiconductor substrate, wherein the widths of the first gate lines are different from the widths of the second gate lines;
    forming a first interlayer insulating layer on the semiconductor substrate, and over the first and second gate lines;
    forming recesses in an upper portion of the first interlayer insulating layer located over a portion of the first interlayer insulating layer extending between adjacent ones of the first gate lines, the recesses constituting first contact holes, respectively;
    forming first spacers that cover the sides of the first contact holes, respectively, and leave second contact holes therein;
    extending the second contact holes downward through the first interlayer insulating layer and to the semiconductor substrate, thereby forming third contact holes that expose the semiconductor substrate at locations between the adjacent ones of the first gate lines;
    removing the first interlayer insulating layer from beneath locations between the first spacers, thereby forming at least one fourth contact hole; and
    filling the third and the fourth contact holes with conductive material, thereby forming first contacts in the third contact holes and a second contact in each said at least one fourth contact hole.

12. The method according to claim 11, wherein the forming of the first contact holes comprises:
    forming a first photoresist pattern on the first interlayer insulating layer; and
    etching the first interlayer insulating layer using the first photoresist pattern as an etch mask.

13. The method according to claim 11, wherein the forming of the first spacers and the second contact holes within the first contact holes comprises:
    depositing a layer of first spacer material over the bottoms and sides of the first contact holes; and
    etching the layer of first spacer material.

14. The method according to claim 11, wherein the extending of the second contact holes downward through the first interlayer insulating layer to form the third contact holes comprises etching the first interlayer insulating layer using the first spacers as an etch mask.

15. The method according to claim 11, further comprising forming an etch stop layer and a second interlayer insulating layer on the first interlayer insulating layer, and wherein the forming of the at least one fourth contact hole comprises:

forming a photoresist pattern on the first interlayer insulating layer that fills the second contact holes and exposes the second interlayer insulating layer between the adjacent ones of the first spacers;

removing the second interlayer insulating layer from between the adjacent ones of the first spacers by etching the second interlayer insulating layer using the photoresist pattern as an etch mask; and subsequently etching the first interlayer insulating layer.

16. A method of forming contact structure of a semiconductor device, comprising:

providing a substrate having a conductive region;

forming an interlayer insulating layer on the substrate;

forming first contact holes in the interlayer insulating layer;

forming first spacers that cover the sides of the first contact holes, respectively, and leave second contact holes therein that expose the interlayer insulating layer, wherein the interlayer insulating layer exhibits an etch selectivity relative to the first spacer material with respect to a first etch process;

etching the interlayer insulating layer from between the first spacers using said first etch process, thereby forming at least one third contact hole; and filling the second contact holes and the at least one third contact hole with conductive material, thereby forming first contacts in the second contact holes, respectively, and a respective second contact in each said at least one third contact hole, wherein the first and second contacts are aligned and alternately disposed in a row in a first direction.

17. The method according to claim 16, wherein the first etch process is a dry etch using an etch gas selected from the group consisting of $CHF_3/O_2$, $CH_2F_2$, $CH_3F$ and $C_4H_8$.

18. The method according to claim 16, wherein the interlayer insulating layer is a nitride layer, the first spacers are of an oxide, and the first etch process is a wet etch process comprising etching the interlayer insulating layer with a phosphoric acid solution.

19. The method according to claim 16, wherein the interlayer insulating layer is an oxide layer, the first spacers are of a nitride, and the first etch process is a wet etch process comprising etching the interlayer insulating layer with a solution selected from the group consisting of a hydrofluoric acid solution, a sulfuric acid solution, SC-1, and LAL.

20. The method according to claim 16, further comprising filling the second contact holes with a layer of insulating material selected from the group consisting of an SOG layer, an HSQ layer, a field oxide layer and a TOSZ layer, before the at least one third contact hole is formed.

21. The method according to claim 16, further comprising filling the second contact holes with an oxide layer using a CVD method, before the at least one third contact hole is formed.

* * * * *